United States Patent [19]
Matsuhiro et al.

[11] Patent Number: 6,010,919
[45] Date of Patent: Jan. 4, 2000

[54] METHOD FOR MANUFACTURING SEMICONDUCTOR DEVICES BY USE OF DRY ETCHING

[75] Inventors: Yasushi Matsuhiro, Nukata-gun; Kazushi Asami, Okazaki; Yoshimi Yoshino, Anjo, all of Japan

[73] Assignees: Nippon Soken, Inc., Nishio; Denso Corporation, Kariya, both of Japan

[21] Appl. No.: 08/832,231

[22] Filed: Apr. 3, 1997

[30] Foreign Application Priority Data

Apr. 11, 1996 [JP] Japan .................................. 8-089210
Jan. 28, 1997 [JP] Japan .................................. 9-013949

[51] Int. Cl.⁷ .................................................. H01L 21/00
[52] U.S. Cl. .......................................................... 438/52
[58] Field of Search .................... 438/50, 51, 52, 438/53; 73/514.01, 514.02, 514.03, 514.04, 514.36, 514.37, 514.34

[56] References Cited

U.S. PATENT DOCUMENTS

| | | |
|---|---|---|
| 5,547,539 | 8/1996 | Arasawa et al. . |
| 5,549,785 | 8/1996 | Sakai et al. .......................... 156/644.1 |
| 5,691,794 | 11/1997 | Hoshi et al. ............................ 349/158 |

FOREIGN PATENT DOCUMENTS

| | | |
|---|---|---|
| 716 441 | 6/1996 | European Pat. Off. . |
| 1-251735 | 10/1989 | Japan . |
| 6-112302 | 4/1994 | Japan . |
| 6-147903 | 5/1994 | Japan . |
| 92/00609 | 1/1992 | WIPO . |

*Primary Examiner*—Brian Dutton
*Attorney, Agent, or Firm*—Pillsbury Madison & Sutro LLP

[57] ABSTRACT

A manufacturing method of semiconductor devices adaptable for use in microelectronics devices such as angular-rate sensors includes the steps of preparing a silicon wafer having a lamination of a p-type silicon substrate and an n-type epitaxial layer as formed thereon, defining on a specified surface of the wafer a plurality of recess portions each having a reduced-thickness portion on the opposite surface side which consists of the epitaxial layer, forming plural through-going holes in each reduced-thickness portion by causing a gel- or oil-like coolant medium made of a thermally conductive material to be disposed in contact with one surface of the reduced-thickness portion of the silicon substrate and by effecting dry etching of certain region from the other surface of the reduced-thickness portion, and thereafter removing the medium. This medium serves to absorb and dissipate heat generated at the reduced-thickness portion during the dry etching.

26 Claims, 11 Drawing Sheets

METHOD FOR MANUFACTURING SEMICONDUCTOR DEVICES BY USE OF DRY ETCHING

CROSS REFERENCE TO RELATED APPLICATION

This application is based upon and claims the benefit of priority of the prior Japanese Patent Applications No. 8-89210 filed on Apr. 11, 1996 and No. 9-13949 filed on Jan. 28, 1997, the contents of which are incorporated herein by reference.

BACKGROUND OF THE INVENTION

1. Field of the Invention

The present invention relates generally to a manufacturing method of semiconductor devices, and more particularly to a method for manufacturing or fabricating semiconductor devices by use of dry etching techniques.

2. Related Art

One prior known approach to formation of angular rate sensors with piezoelectrically vibratory gyros by use of silicon micro-machine technology has been disclosed in, for example, Published Unexamined Japanese Patent Application (PUJPA) No. 6-147903. More practically, through-going holes are formed by etching in a thin-walled or "reduced-thickness" portion of a silicon substrate, providing a vibrator with a cantilever structure. In this case, the vibrator is formed by performing etching treatment from the opposite surfaces of the silicon substrate. Note that the etching treatment employed here may be generally classified into two categories: (1) fabrication within the surface of silicon substrates (areal etching), and (2) fabrication along the thickness (thickness etching). The silicon-substrate areal fabrication (areal etching) is to directly etch the substrate by photolithography technology with a resist pattern being used as a mask in a manner similar to those of ordinary semiconductor devices; this type of etching is high in degree of freedom of shape while allowing its etching conditions to preferably accord with those of the methods for fabrication of standard semiconductor devices. On the other hand, in the along-the-thickness fabrication (thickness etching), it remains difficult to attain direct etching with a resist pattern being as a mask therefor; alternatively, the shape is to be determined either by utilizing one of dummy or "sacrifice" layer preformed along the thickness of a wafer, etching stopper layer and PN junction or by controlling the etching amount in time management schemes. In this case, the etching amount (area and depth) is relatively greater as compared with ordinary fabrication of semiconductor devices while the etching conditions tends to be severe if priority is given to throughput.

Figure 18:
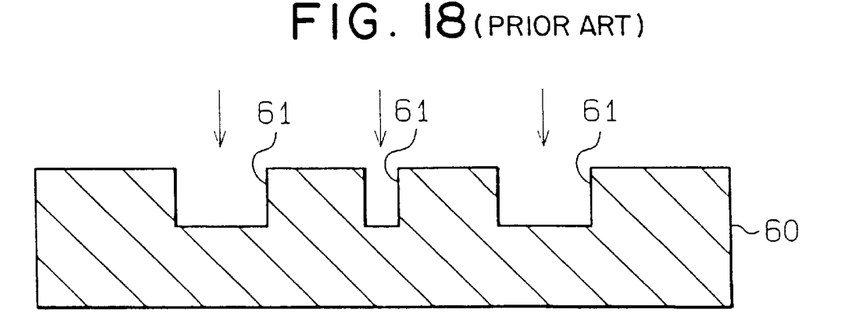
FIGS. 18 through 23 are diagrams showing in cross-section several prior art devices.
Figure 19:
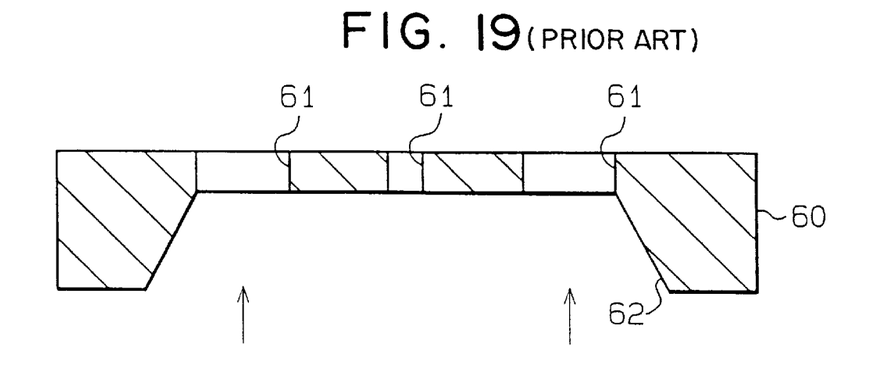

Due to the above-mentioned characteristics, the areal etching is typically designed so that the top surface is first subject to dry etching, whereas the thickness etching causes the bottom surface to be first processed by wet etching techniques. Accordingly, when a silicon substrate is etched from its both surfaces in order to form an intended vibrator, areal etching is effected with respect to a silicon substrate 60 thereby defining recess portions 61 as shown in FIG. 18. Thereafter, as shown in FIG. 19, thickness-etching is then effected with respect to the silicon substrate 60 forming a recess portion 62 to thereby let the recesses 61 be through-going holes. Alternatively, as shown in FIG. 20, a silicon substrate 63 is subject to the thickness-etching forming a recess portion 64; then, as shown in FIG. 21, the silicon substrate 63 is subject to areal etching treatment defining several through-holes 65.

A comparison of these two etching schemes is as follows. With the etching method shown in FIGS. 18 and 19, during the thickness etching, etchant liquid or gas tends to locally enter and leak through the recesses 61 as completed at termination of the areal etching process—namely, the resulting through-holes defined—resulting in unexpected etching and/or undesired surface configuration being easily occurred on the substrate surface and on the side surfaces of each recess 61. On the other hand, with the method of FIGS. 20 and 21, this offers an advantage that elements to be formed on the top surface and their associated lead wires can be free from the thickness-etching of strict conditions because this method is arranged so that the thickness-etching is effected from the bottom surface to form the reduced-thickness portion 66 and thereafter the areal etching is performed from the top surface thereof. For this reason, the method shown in FIGS. 20 and 21 may be employed for the manufacture of sensors.

Figure 20:
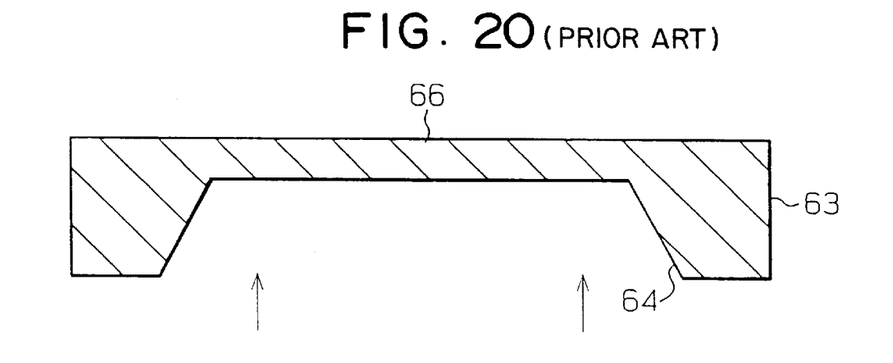
Figure 21:
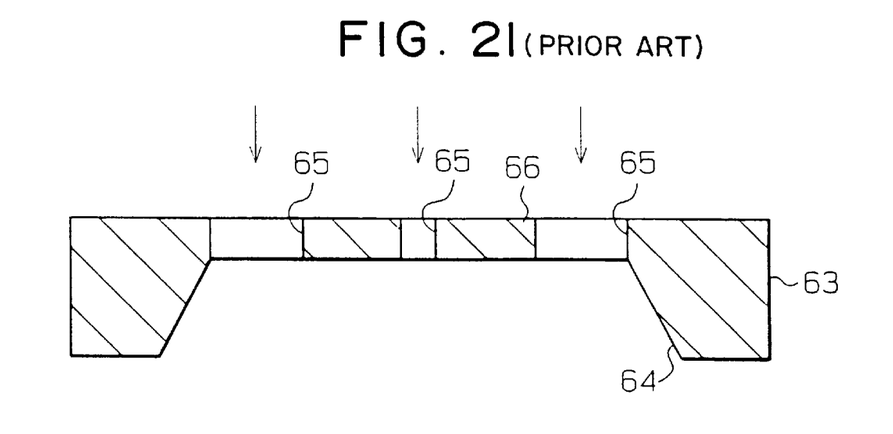
Figure 22:
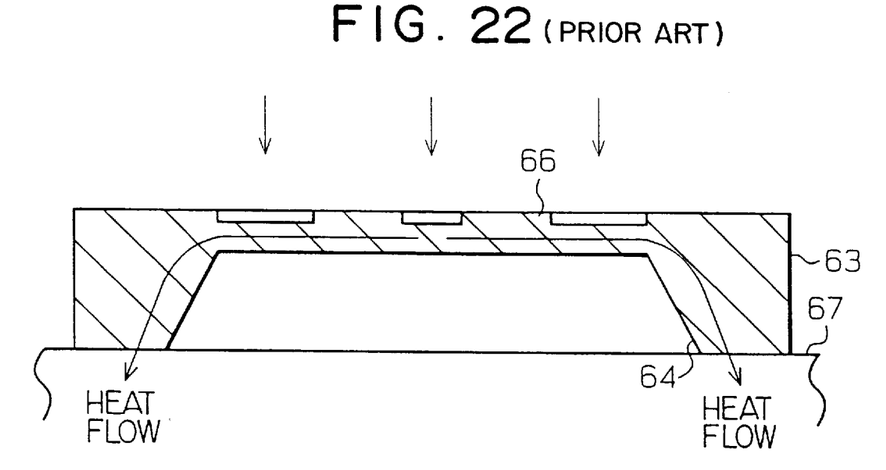
Figure 23:
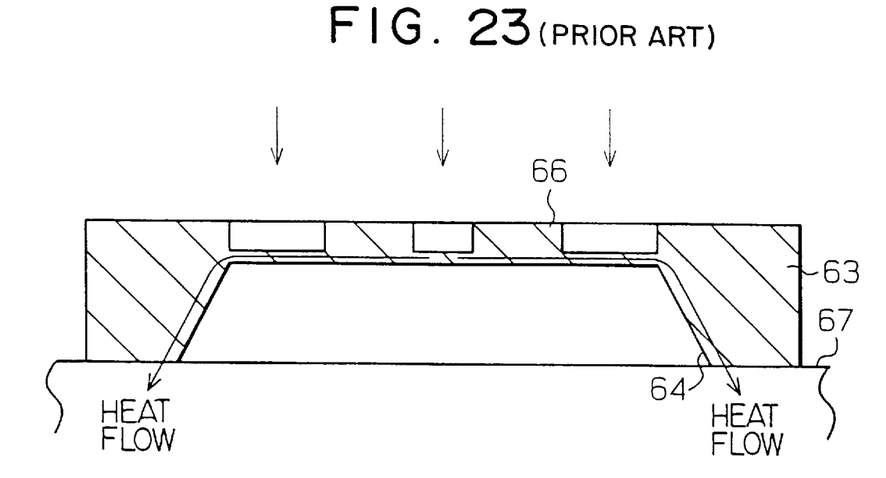

However, where dry etching is effected with respect to the reduced-thickness portion 66 by use of the method of FIGS. 20–21, a local temperature increase will arise for the following reasons. As shown in FIG. 22, the reduced-thickness portion 66 formed by thickness-etching is less in heat transmission area than non-etched portions; therefore, heat hardly flows toward the side of a base plate 67. Also, as shown in FIG. 23, when the areal etching is carried out, the heat transmission area decreases with progress of etching thereby rendering more difficult the flow of heat toward base plate 67.

The local temperature increase badly behaves to increase the rate of reaction of the silicon substrate (wafer) with etching gas and radicals. As a result, the side-etching rate increases while the silicon substrate 63 and reduced-thickness portion 66 can deform due to application of thermal stress causing an etching mask to be rough and overetched at edges thereof, which in turn leads to a decrease in accuracy of areal etching treatment.

A technique of cooling the substrate by supplying thereto chosen coolant gas to the substrate being placed on the supporting table in a chamber during etching has been disclosed in PUJPA Nos. 1-251735, 6-112302, 7-249586 and others. It might be considered that the technique disclosed therein is employed for supplying the substrate with coolant gas during etching for formation of through-holes. However, with such an arrangement, when through-holes are completed penetrating substrate, such coolant gas attempts to enter or "invade" the inside of the etching chamber making it impossible to attain regular etching treatment, which in turn results in a decrease in fabrication accuracy.

As the cooling method of the substrate (wafer) for use in standard dry etching apparatus, another method is known which forces the substrate to be in close contact at its bottom surface with the stage which has a cooling function. This method is disclosed, for example, in PUJPA No. 8-165571, wherein chosen refrigeration medium or coolant is sealed on the upper surface of the support table by using a flexible sheet while placing the substrate on this sheet with an elastic rubber member being laid therebetween, thereby cooling the substrate by the coolant during etching. Presumably, this technique is used to attain the etching for formation of through-holes. However, with this approach, while it is required that the substrate be disposed above the coolant-sealing flexible sheet with the rubber member being interposed therebetween after formation of the recess portion 64 in the silicon substrate 63 of FIG. 20, it remains unable to dispose the coolant-sealing flexible sheet and rubber member in such a way as to almost completely fill the inside of recess 64 of silicon substrate 63 shown in FIG. 20, which results in a decrease in cooling efficiency with the fabrication accuracy degraded.

SUMMARY OF THE INVENTION

It is therefore an object of the present invention to provide a method for manufacturing semiconductor devices capable of eliminating a decrease in fabrication accuracy of dry etching with respect to a semiconductor substrate.

According to the present invention, a through-going opening or hole which extends through a reduced-thickness portion is formed by causing a gel- or oil-like medium made of a chosen thermally conductive material to be disposed in contact with one surface of the reduced-thickness portion of the semiconductor substrate and then performing dry etching of certain region from the other surface of the reduced-thickness portion; thereafter, the medium is removed away. Note here that during the dry etching, heat generated will escape by way of the gel- or oil-like medium. Accordingly, any local temperature increase will no longer take place enabling elimination of a decrease in etching fabrication accuracy.

Further, with the present invention, since the gel- or oil-like medium is specifically employed, it will by no means occur that the medium attempts to enter or "invade" the inside of an etching chamber upon completion of through-going openings or holes penetrating through the substrate.

Especially, it is preferable that disposal of the medium is performed in such a way that this medium is hardened while causing a liquid medium before hardening to be in contact with one surface of the reduced-thickness portion. This may enable such liquid medium to be brought into close contact with the silicon substrate enhancing the cooling efficiency.

In accordance with another aspect of the invention, a recess is defined by etching certain region from a first surface of a semiconductor substrate, enabling resultant recess to be filled with a gel- or oil-like medium made of thermally conductive material. Thereafter, dry etching is effected with respect to certain region of the reduced-thickness portion formed on the bottom of the recess from a second surface of the semiconductor substrate to thereby form one or more through-going holes extending through the reduced-thickness portion. Finally, the medium is removed away. This ensures that any possible heat generated will escape through the medium as disposed within the recess, which in turn leads to capability of eliminating a local temperature increase thus avoiding occurrence of a decrease in accuracy of etching fabrication. In this case also, it may be preferable that the disposal of the medium is done such that it is hardened while causing liquid medium before hardening to be filled within the recess portion.

In accordance with a still another aspect of the invention, fabrication of the through-going hole may include the steps of forming as a partition wall or "barrier" a separation film on one surface of a reduced-thickness portion as formed in a semiconductor substrate, and forming one or several through-going holes extending through the reduced-thickness portion by dry etching of certain region at the reduced-thickness portion while supplying a refrigerant or coolant fluid to the separation-film forming surface of the reduced-thickness portion. Thereafter, the separation film is then removed away. In this case, during such dry etching, the coolant fluid is supplied under a specific condition that permits accomplishment of successful separation from the semiconductor substrate by the separation film acting as the barrier. The coolant fluid serves to absorb and dissipate heat as generated in the reduced-thickness portion. This may prevent a temperature increase from being locally occurred avoiding a decrease in etching-fabrication accuracy. Another advantage of the invention is that presence of the separation film may serve to prevent the medium from entering the inside of an etching chamber through resultant through-going hole(s) in the substrate. A further advantage is that cooling efficiency can be enhanced by supplying the coolant fluid to the separation film contacted with the substrate.

In accordance with a yet another aspect of the invention, a recess is formed by etching of certain region from a first surface of a semiconductor substrate, permitting formation of a separation film acting as a barrier on the inner wall surface of the recess. In this case, more than one through-going hole extending through a reduced-thickness portion are formed by dry etching of certain region from a second surface of the semiconductor substrate at the reduced-thickness portion, while permitting continuous supply of coolant fluid to the inside of recess. Thereafter, the separation film is removed away. In this approach, the cooling fluid is supplied to the inside of such recess which is in the sealed state by the presence of the separation film acting as the barrier, absorbing and dissipating heat. This advantageously serves to eliminate occurrence of a local temperature increase, avoiding a decrease in accuracy of etching.

It should be noted that the dry etching may be reactive ion etching. Note also that the use of a gel-like medium including silicon resin or the like for heat dissipation of the reduced-thickness portion may eliminate by its inherent flexibility any adverse affection or influence with respect to the semiconductor substrate otherwise occurring due to application of thermal stress thereupon.

It should further be noted that in cases where low vapor-pressure fluid (such as fluorine-based polymer oil, and silicon-based polymer oil, by way of example) is employed as the cooling fluid, this may ensure that vaporization will hardly take place upon application of heat during etching, thereby enabling retainment of the etching environment required. Additionally, the cooling fluid may be gaseous material (such as inert gas, for example).

These and other objects, features and advantages of the invention will be apparent from the following more particular description of preferred embodiments of the invention, as illustrated in the accompanying drawings.

DETAILED DESCRIPTION OF THE PREFERRED EMBODIMENTS

First Embodiment

A first embodiment of this invention will now be described with reference to the accompanying drawings.

This embodiment assumes that the concept of the invention is applied to semiconductor angular-rate sensors using silicon micro-machine technology. A semiconductor angular-rate sensor shown in FIG. 1 has a silicon substrate 1 defining a square frame member 2, and a vibratory element 3 integrally disposed inside the frame member 2.

Figure 2:
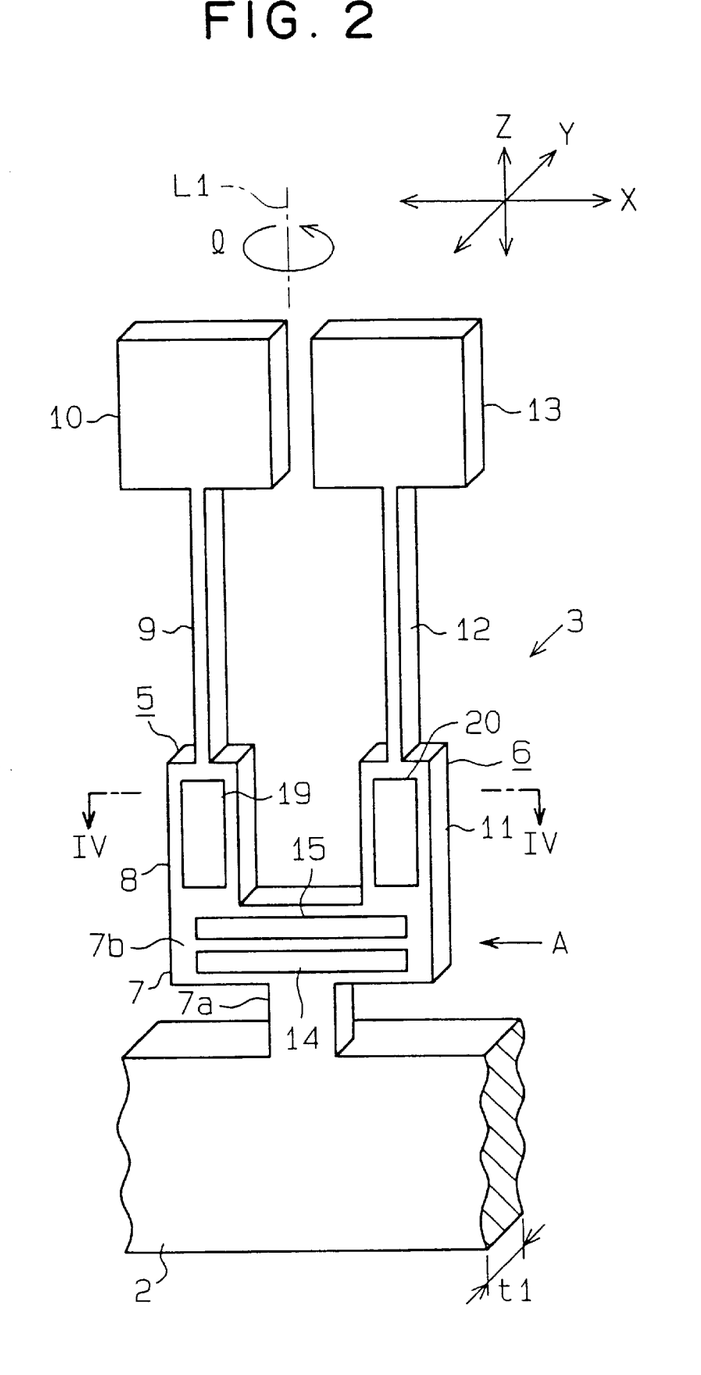
FIG. 2 is an enlarged depiction of a vibrator as used in the embodiment of FIG. 1.

FIG. 2 depicts an enlarged view of the vibrator 3. In FIG. 2, a three-axis coordinate system is employed which assumes the lateral or horizontal direction of a paper as X direction (X axis), the normal direction to the paper as Y direction (Y axis), and the longitudinal or vertical direction thereof as Z direction (Z axis).

A detailed explanation is as follows.

Figure 1:
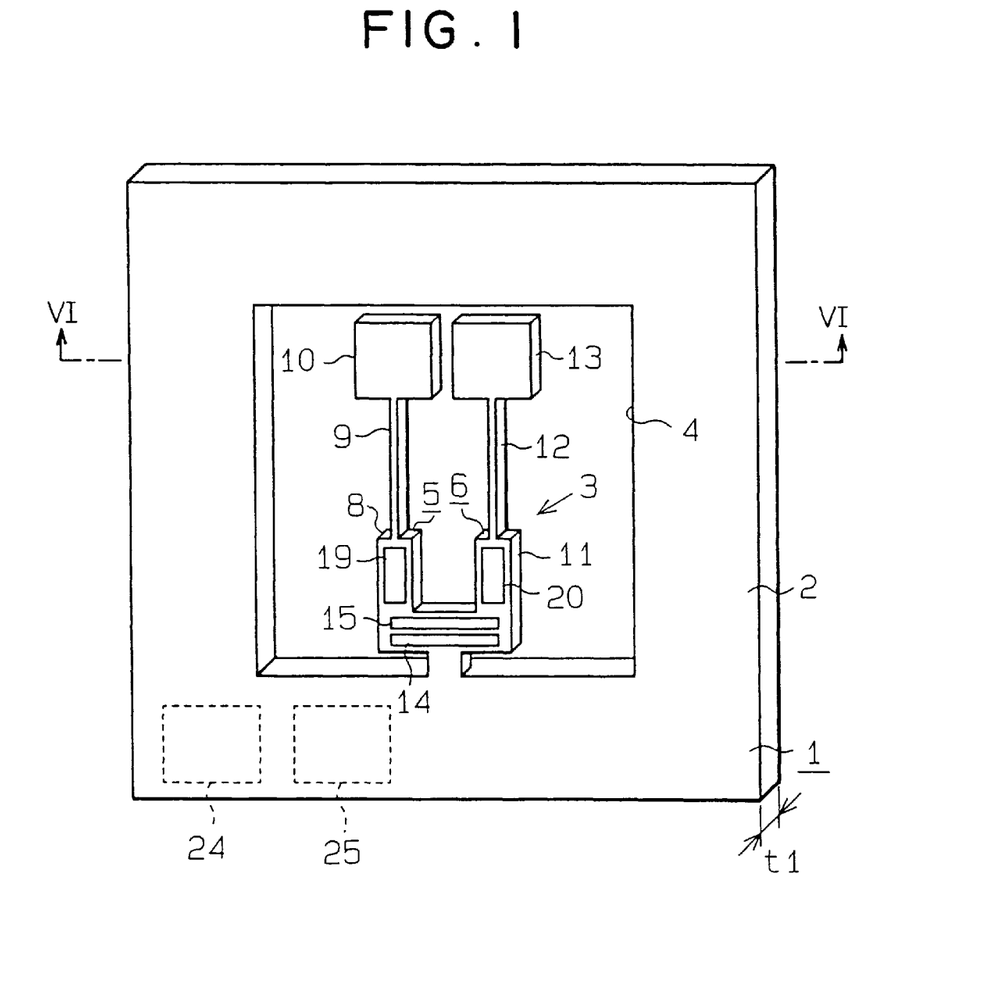
FIG. 1 is a diagram showing a perspective view of a semiconductor angular-rate sensor in accordance with a first preferred embodiment of the present invention.

As shown in FIG. 1, the angular-rate sensor embodying the invention makes use of the silicon substrate 1 of a selected thickness t1. The silicon substrate 1 has a square vacant space or "opening" 4 as centrally formed therein to thereby define the square frame member 2 and tuning-fork shaped vibrator 3 integral with frame 2 as shown. Vibrator 3 is used in the upstanding state. Note here that vibrator 3 is a reduced-thickness section which is less in thickness than square frame 2.

As shown in FIG. 2, the vibrator 3 essentially consists of a pair of parallel arm sections 5, 6 elongated upwardly, and a coupler section 7 which couples these arms 5, 6 to square frame 2. Further, one arm 5 consists of a wide arm portion 8 exhibiting a rectangular shape, a narrow arm portion 9, and a square-shaped mass portion 10. Similarly, the other arm 6 consists of a wide arm portion 11 resembling a rectangle, narrow arm portion 12, and mass portion 13.

The coupler 7 is in a letter "T" shape, allowing a vertical portion 7a of the coupler 7 to extend upwardly from the upper surface of the square frame 2 while allowing a horizontal portion 7b to laterally extend from the upper edge portion of vertical portion 7a. The wide arm portion 8 is upwardly extended from the upper surface of horizontal portion 7b whereas the other wide arm portion 11 extends upwardly from the upper surface of horizontal portion 7b.

Further, the narrow arm portion 9 extends upwardly from the upper surface of wide rectangular arm portion 8 and has its upper edge at which the square-shaped mass section 10 extends upwardly. Similarly, the narrow arm portion 12 is extended upwardly from the upper surface of the wide rectangular arm portion 11 and has its upper edge from which the square-shaped mass section 13 extends upwardly.

Figure 3:
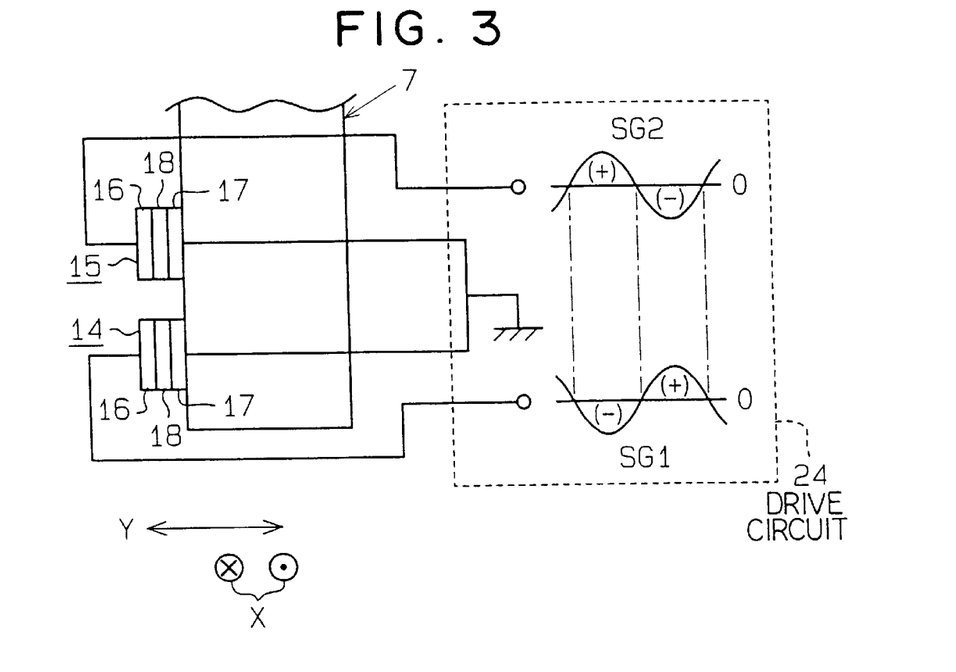
FIG. 3 illustrates a side view of the vibrator as looked at from a direction designated by line A in FIG. 2 along with its associated electrical circuitry.

A pair of first and second piezoelectric elements 14, 15 each acting as a driver are disposed on the front surface of the horizontal portion 7b of coupler 7 of vibrator 3. These first and second piezoelectric driver elements 14, 15 are in stripe shape extending laterally (in the X direction) while the both piezoelectric driver elements 14, 15 are disposed in parallel to each other. As shown in FIG. 3 which depicts a side view (as looked at along line A) of the structure of FIG. 2, each of these piezoelectric elements 14, 15 has a multilayer structure consisting of electrode thin films 16, 17 and an intermediate piezoelectric thin film as sandwiched therebetween.

Figure 4:
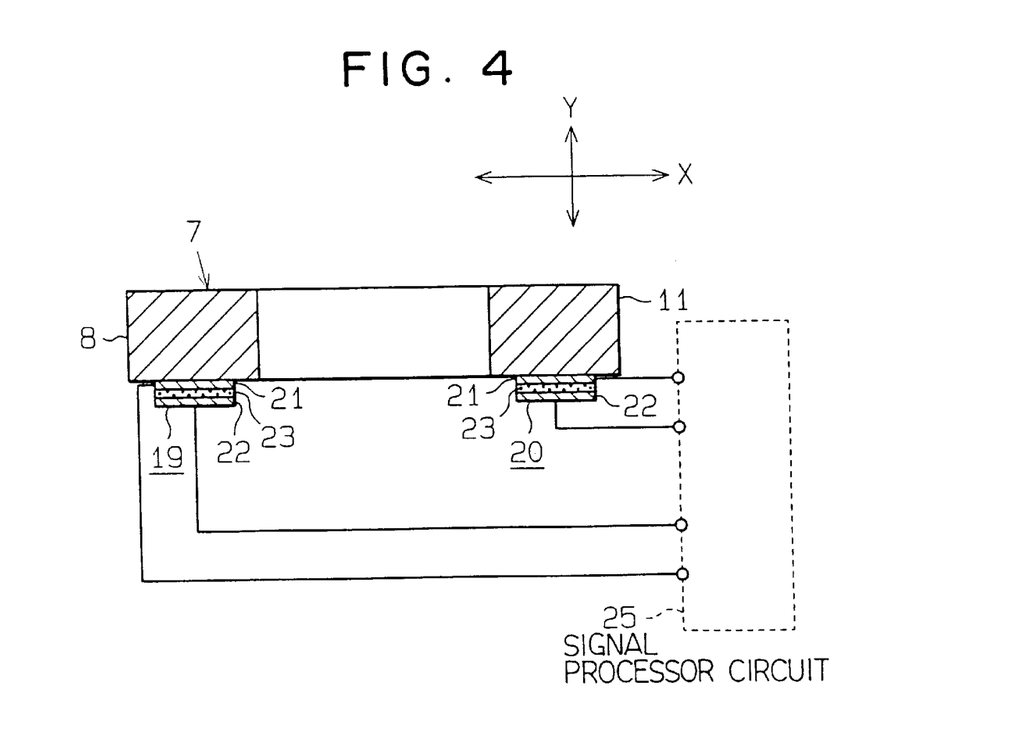
FIG. 4 depicts a cross-section al view of the vibrator of FIG. 2 as taken along line IV—IV.

Turning back to FIG. 2, there is disposed a piezoelectric detection element 19 on the front surface of the wide arm portion 8 of vibrator 3. Similarly, another piezoelectric detection element 20 is disposed on the front surface of the wide arm portion 11 of vibrator 3. Each piezoelectric detector 19, 20 is in rectangular shape. As can be seen in FIG. 4 which shows a cross-section of the FIG. 2 structure taken along line IV—IV, each piezoelectric element 19, 20 has a multilayer structure consisting of inner and outer electrode thin films 21, 22 and an intermediate thin film 23 laid therebetween, which is made of a chosen piezoelectric material.

The piezoelectric elements 14, 15, 19, 20 are made of ZnO or the like as the thin-film piezoelectric materials (18, 23). These ZnO films may be formed by sputtering techniques. The piezoelectric driver elements 14, 15 exhibit certain characteristics: These will physically expand upon application of a selected potential that is positive in polarity relative to the ground potential; they may shrink upon application of a negative potential.

As shown in FIG. 1, the semiconductor substrate 1 has an electrical drive circuit 24 and signal processor circuit 25 which are fabricated thereon using semiconductor microelectronics fabrication technology to be integral with the substrate 1 providing a "one chip" IC structure.

As shown in FIG. 3, the first and second piezoelectric driver elements 14, 15 are electrically connected via aluminum thin-film leads to the drive circuit 24. More specifically, both the electrode thin film 17 of first piezoelectric driver 14 and that of second piezoelectric driver element 15 are coupled to ground together, and an alternate current (AC) drive signal SG1 (sine wave) is provided for the electrode thin film 16 of first piezoelectric driver 14. The center of amplitude of this drive signal SG1 is equal to the ground potential. Another AC drive signal SG2 which is reverse in phase to the AC signal SG1 is provided for the electrode thin film 16 of second piezoelectric driver 15.

As shown in FIG. 4, the piezoelectric detectors 19, 20 are electrically coupled to the signal processor circuit 25 through aluminum thin films or the like allowing electrical signals issued from piezoelectric detectors 19, 20 to be supplied to signal processor circuit 25. More specifically, respective electrode thin films 21, 22 of piezoelectric detectors 19, 20 are electrically connected to signal processor 25 to supply, as electrical signals, any deviation along the forward/backward directions (Y direction) at the wide arm portions 8, 11 of vibrator 3.

The principle of angular rate measurement effected using the foregoing angular-rate sensor embodying the invention is as follows.

Figure 5A:
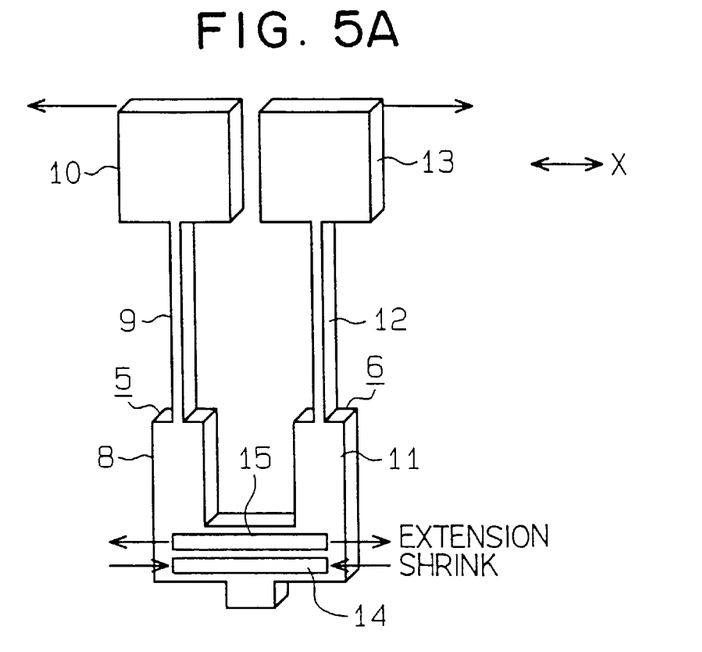
FIGS. 5A and 5B are each diagrammatic representation for explanation of the principle of operation.

In the drive circuit 24 of FIG. 3, AC signals (drive signals) SG1, SG2 are generated, which are reverse in phase, to the first and second piezoelectric drivers 14, 15. In responding thereto, as shown in FIG. 5A, the lower, first piezoelectric driver 14 operates to shrink whereas the upper, second piezoelectric driver 15 attempts to expand accordingly. These shrink and extension operations take place at a time (as synchronized with each other). Due to such shrink and extension operations of drivers 14, 15, the arm sections 5, 6 significantly deform in such a way that the upper edge side portions thereof go far from each other in the horizontal direction (X direction).

Figure 5B:
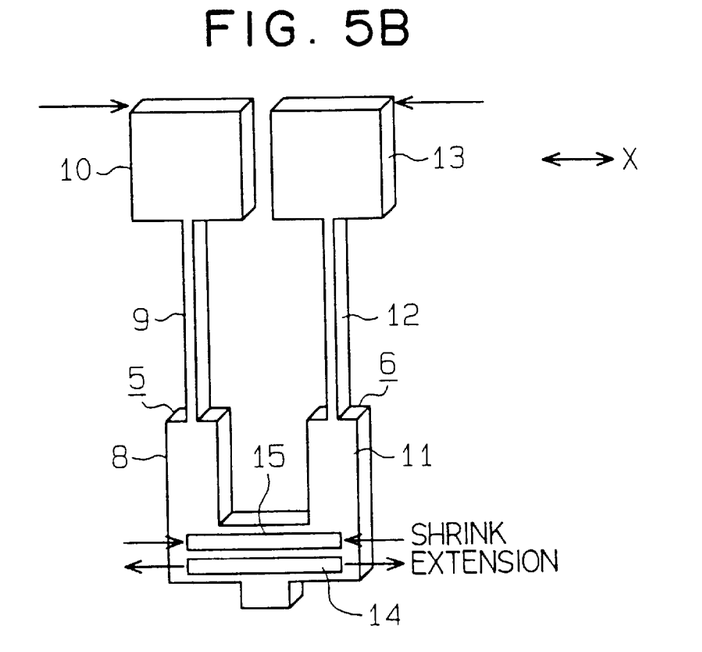

Thereafter, as shown in FIG. 5B, the upper second piezoelectric driver 15 attempts to shrink whereas the lower first piezoelectric driver 14 expands. These operations occur simultaneously (in synchronism with each other). Such extension and shrink operations of piezoelectric drivers 14, 15 cause the arms 5, 6 to significantly deform such that the upper edges thereof come closer to each other in the horizontal direction (X direction).

The operations of FIGS. 5A and 5B—namely, the expanding and shrinking operations of the first and second piezoelectric drivers 14, 15—will be repeated forcing arms 5, 6 to vibrate laterally (in the X direction). The resulting vibrations act to provide driving vibrations (energizing operation) as required.

During the energizing operation of vibrator 3, when rotational angular rate Ω is applied to the center axis L1 of vibrator 3 as shown in FIG. 2, then Coriolis force is generated in the forward and backward directions (Y direction). Resultant vibration components are detected by the piezoelectric detectors 19, 20 and are then sent to the signal processor 25. In responding, processor 25 performs a differential amplification operation providing an output signal indicative of the degree of angular rate.

A manufacturing method of the semiconductor angular-rate sensor thus arranged will now be described with reference to FIGS. 6 to 10. Note that FIGS. 6–10 each represents a cross-section of the sensor of FIG. 1 as taken along line VI—VI shown therein.

Figure 6:
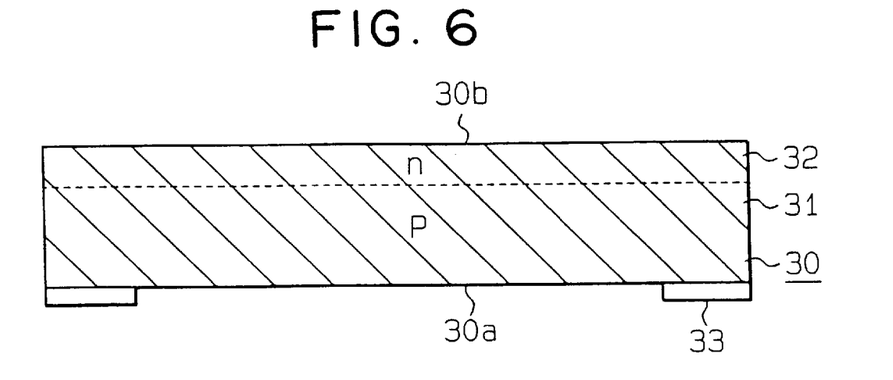
FIGS. 6 to 10 and 13 illustrates, in cross-section, some of the major steps in the manufacture of the semiconductor angular-rate sensor.
Figure 11:
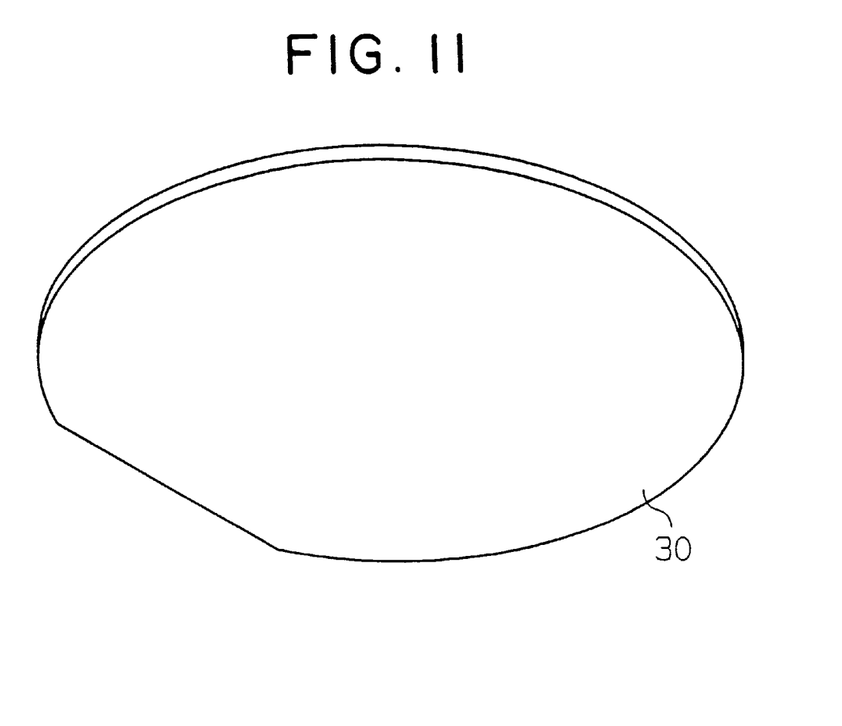
FIGS. 11 and 12 illustrates, in perspective view, some of the major steps of the manufacture of a wafer embodying the invention.

First, as shown in FIG. 6, a silicon substrate 30 is prepared which has a p-type silicon substrate 31 and an n-type epitaxial layer 32 formed thereon. More specifically, a silicon wafer (30) is prepared as shown in FIG. 11.

Figure 7:
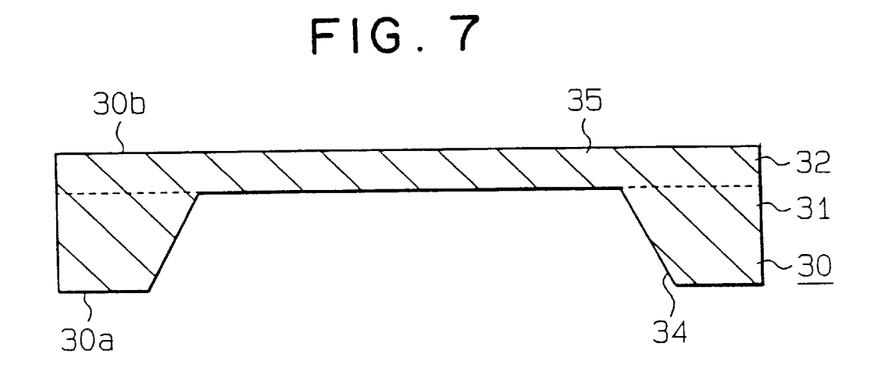
Figure 12:
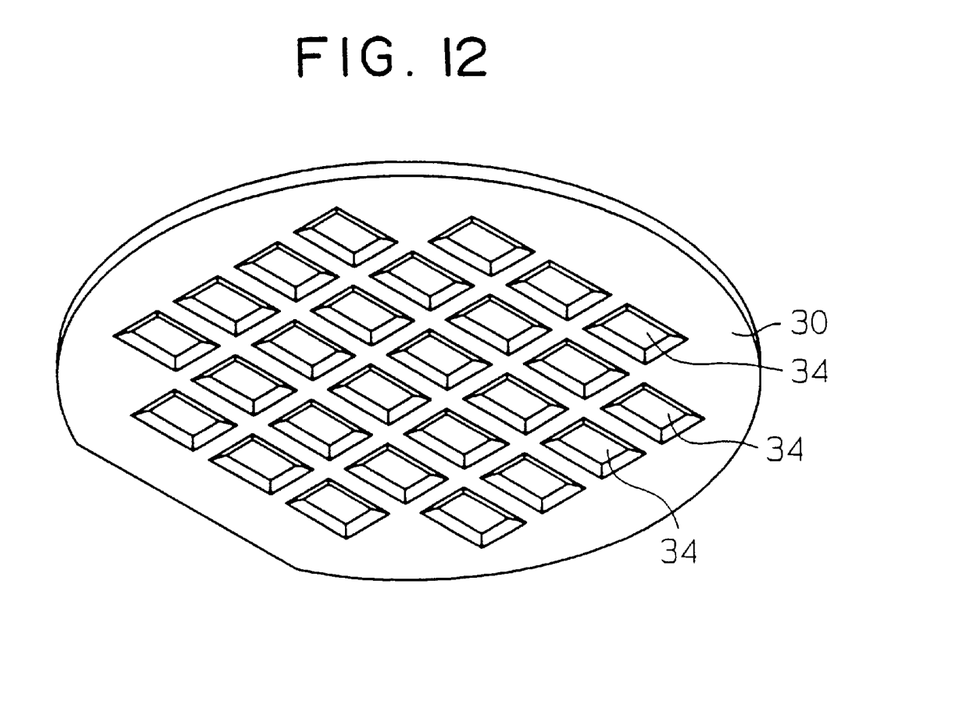

This silicon wafer 30 is later formed with several elements for use in constituting the drive circuit 24 and signal processor circuit 25 as well as the piezoelectric elements 14, 15, 19, 20 along with necessary aluminum lead wires associated therewith. A mask material 33 is deposited on the entire top surface of p-type silicon substrate 31 (first surface 30a of silicon substrate 30); then, as shown in FIG. 7, wet etching treatment is carried out using a chosen etchant such as KOH or its equivalents causing selected parts of p-type silicon substrate 31 to be removed away as shown in FIG. 7. This etching treatment results in formation of a recess portion 34 while allowing a thin-walled or reduced-thickness portion 35 consisting of n-type epitaxial layer 32 to be defined at the "bottom" of such recess portion 34 when viewed upside down. More specifically, as shown in FIG. 12, a number of recess portions 34 are formed in one surface of the silicon wafer 30 at specified locations for formation of a reduced-thickness portion 35 at the bottom of a respective one of such recess portions 34.

Note here that the reduced-thickness portion 35 is for fabrication of the vibrator shown in FIG. 1 whereas the remaining increased-thickness portions of wafer 30 will act as the square frame 2 of FIG. 1.

Figure 8:
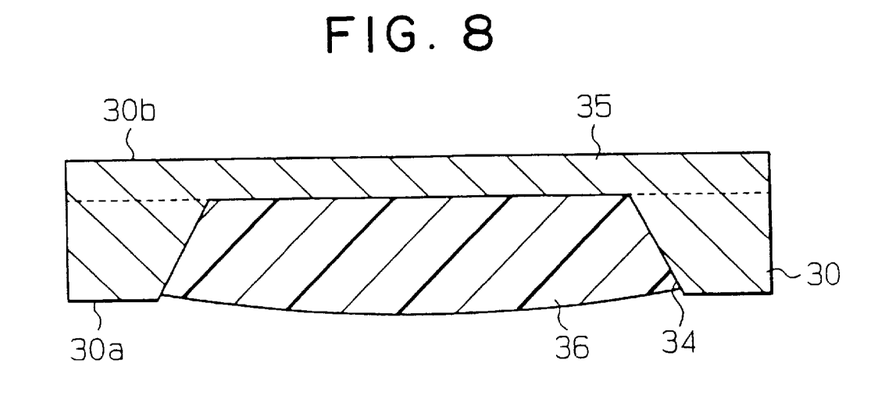
Figure 13:
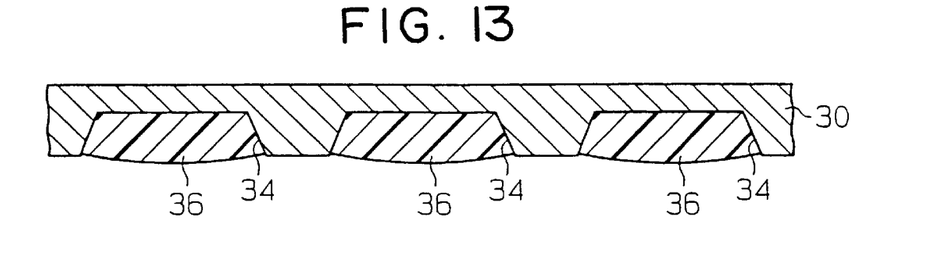

Thereafter, as shown in FIG. 8, each recess portion 34 is filled with a thermally hardenable silicon resin (medium) 36, which is flexible in nature since it is not actually hardened yet. Specifically, as shown in FIG. 13, the thermally hardenable silicon resin 36 prior to hardening is filled within the individual one of plural recess portions 34 of silicon wafer 30. When this filling is done, thermal hardenable silicon resin 36 before hardening behaves like fluid; accordingly, it may be successfully embedded in recess 34 without any gaps therebetween.

Next, thermal hardening treatment is carried out by supplying moisture vapor to the thermally hardenable silicon resin 36 at a temperature of 100° C. for 30 minutes. Resultant silicon resin 36 thus formed is a thermally conductive material and exhibits gel in state. In this way, silicon resin 36 (thermally conductive gel-like medium) is disposed so that it is in contact with one surface of each reduced-thickness portion 35 as formed in the silicon substrate 30, while allowing the remaining opposite surface of reduced-thickness portion 35 to act as the starting plane of dry etching to be later described.

It should be noted that the silicon resin employed here may alternatively be hardener-added silicon resin rather than the aforesaid thermal hardenable silicon resin; in this case, unhardened liquid resin is filled in each recess 34 and then altered in state to gel by leaving it at room temperatures for an extended length of time period.

Figure 9:
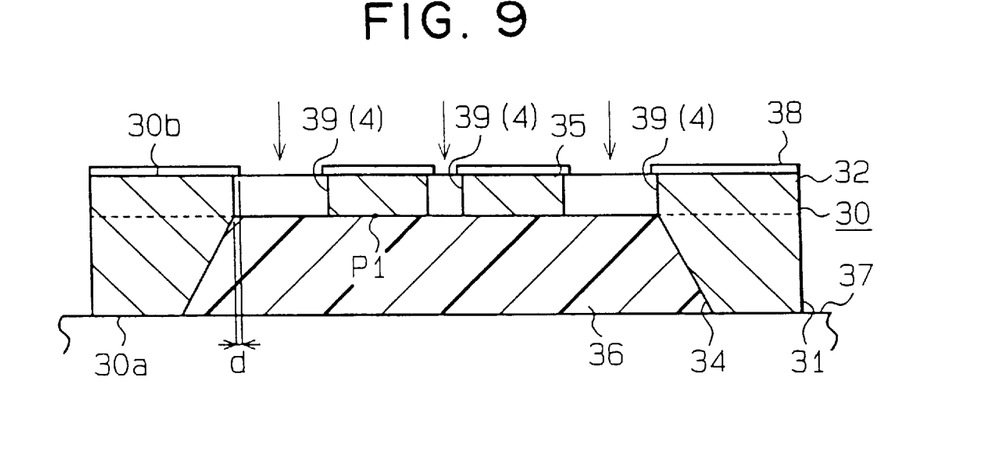

Thereafter, as shown in FIG. 9, the silicon substrate 30 is placed on the stage (support base called the "susceptor") with the silicon resin 36 facing downward. Then, the n-type epitaxial layer 32 is etched by photolithography such as reactive ion etching (RIE) techniques in such a way that the surface of n-type epitaxial layer 32 (the surface 30b of silicon substrate 30) is first subject to the etching process. In other words, dry etching is performed (areal etching is done) with a mask material 38 disposed on the surface of n-type epitaxial layer 32. Due to this etching, a predefined number of through-going openings or holes 39 are formed, which are for definition of the vacant space 4 of FIG. 1.

During the dry etching process, the through-going holes 39 are formed due to ion impulse and/or reaction of reactive ions or radicals; when this is done, heat can be generated at those locations whereat through-holes 39 are formed. Resultant heat are absorbed and dissipated by silicon resin 36 and will escape to the side of stage (support base) 37, which serves to eliminate occurrence of a local increase in temperature. In other words, silicon resin 36 embedded within recess portions 34 functions as an excellent heat transmission path which may advantageously serve to accelerate dissipation of heat while causing the thermal conductive cross-sectional area at locations of formation of reduced-thickness portions 35 in silicon substrate 30 to be equal to or greater than that of the remaining regions of substrate 30. Accordingly, it becomes possible to eliminate an undesirable increase in side-etching rate without having to increase the rate of reaction between radicals and silicon substrate 30 while simultaneously avoiding deformation of silicon substrate 30 and reduced-thickness portions 35 due to application of thermal stress, without leading to occurrence of dry-spot roughness and overetching at the edges of etching mask. Furthermore, even after completion of etching process (formation of through-holes 39), silicon resin 36 continues to act as the heat transmission path suppressing or preventing the local temperature increase at the regions of formation of reduced-thickness portions 35. This makes it possible to eliminate any degradation in areal etching accuracy.

It should be noted that the through-holes 39 measure approximately 100 μm in depth. And, a gap (so-called the "side-etching width") d between the edge of mask material and the edge of each through-hole 39 may be given as:

$$d/D < 10,$$

where D is the etching depth. Also, a temperature increase at the back surface of reduced-thickness portion 35 measured 180° C. in maximum. Comparatively explaining, where dry etching is performed with no silicon resin being filled in recess portions 34, the same relation was:

$$d/D \approx 2,$$

while resultant temperature increase on the back surface of reduced-thickness portions 35 in this case was as large as 250° C. in maximum.

Figure 10:
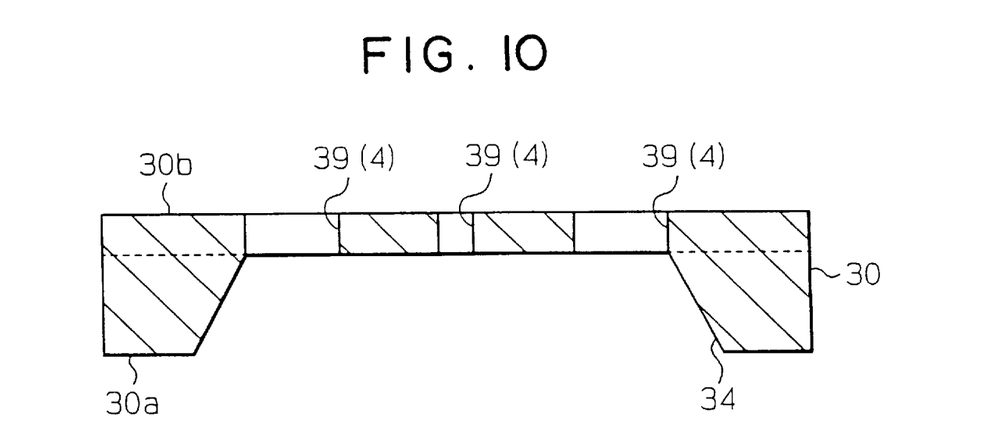

After formation of through-holes 39, as shown in FIG. 10, the silicon resin 36 filled in each recess 34 is then removed away using chosen releasant. Thereafter, the silicon wafer 30 is next subject to dicing process cutting it into multiple chips whereby the semiconductor angular-rate sensor of FIG. 1 is completed.

One significant advantage of the illustrative embodiment is the capability of suppressing an increase in substrate temperature while simultaneously retaining an increased heat transmission area due to the presence of silicon resin 36. More specifically, the etching rate will not remain constant with respect to each through-hole formation region when areal etching reaction reaches its termination point and can vary in some cases. This may result in correspondence of etching-completed (penetration) portions and non-etched portions in resultant substrate, which in turn causes it to locally increase in temperature. Even in such cases, however, the heat transmission area provided by silicon may decrease at certain locations whereat etching is completed (holes has penetrated completely). In contrast, with the embodiment, due to presence of silicon resin 36, it becomes possible to retain sufficient area for heat transmission enabling elimination of any unwanted local temperature increase of the substrate.

Another advantage of the embodiment is that since the gel-like medium is employed, it will no longer happen that such medium enters or "invades" the inside of the etching chamber when penetration of through-holes is completed in the substrate. More specifically, the silicon resin 36 used as the medium is specifically disposed in such a way that resin 36 is brought into close contact with one surface of the reduced-thickness portion 35 as a result of unhardened liquid medium 36 being filled within each recess 34 and is then hardened. Accordingly, this makes it possible to almost perfectly fill the inside of recesses of the silicon substrate with silicon resin 36 thereby enabling enhancement of cooling efficiency. In particular, for the silicon wafer 30 having multiple recesses 34 as shown in FIG. 12, it becomes possible to substantially completely fill the medium 36 into each recess 34 with no gaps therebetween.

A further advantage of the embodiment is that any adverse influence on the silicon substrate 30 due to thermal stress may be suppressed or avoided. This can be said because silicon resin is specifically employed as the medium to be filled within recesses 34 and that its inherent nature of flexibility serves to eliminate or at least greatly reduce thermal stress's influence upon silicon substrate 30.

Second Embodiment

An explanation will now be given of a second embodiment of the invention, which is similar to the first embodiment, supra, except for some points as will be set forth below.

Figure 14:
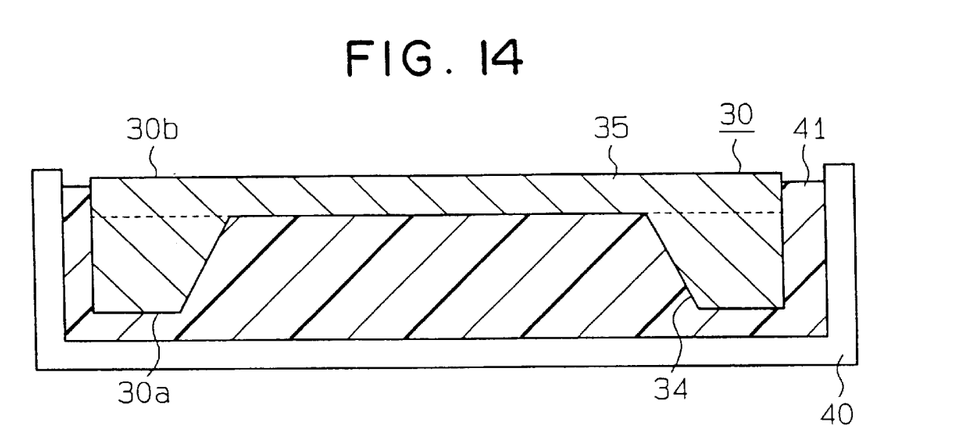
FIGS. 14 and 15 illustrates in cross-section some of the major steps in the manufacture of a semiconductor angular-rate sensor in accordance with another embodiment of the invention.
Figure 15:
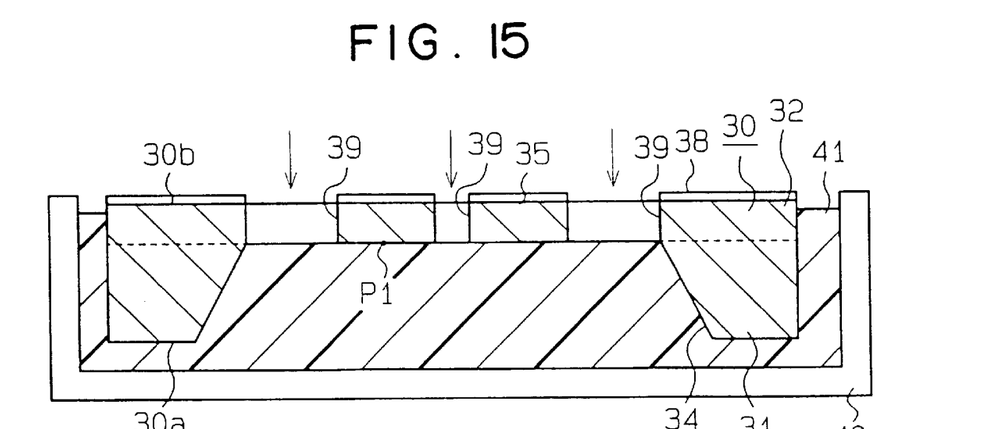

FIGS. 14 and 15 are diagrams showing in cross-section some of the major steps of fabrication of this embodiment.

First, as already shown in FIGS. 6 and 7, a silicon substrate (wafer) 30 is prepared which has a p-type silicon substrate 31 and n-type epitaxial layer 32 formed thereon; then, each recess 34 is formed in the wafer 30 to have a bottom surface at which a reduced-thickness portion 35 is formed, which consists of the n-type epitaxial layer 32.

Further, as shown in FIG. 14, a tray 40 is prepared which retains therein fluorine-based polymer oil 41. This tray 40 is to be put inside an etching chamber (not shown). The polymer oil 41 is a thermally conductive material and remains as fluid under low vapor pressures. Then, the silicon substrate 30 is put into polymer oil 41. At this time, the lower surface of reduced-thickness portion 35 is in oil 41 while preventing the upper surface thereof from being immersed in oil 41. In this way, prior to the dry etching process, silicon substrate 30 being put in oil 41 is set inside the etching chamber.

It may alternatively be arranged so that after putting the silicon substrate 30 into the fluorine-based polymer oil 41, vacuum extraction/evacuation is done for depleting voids in the oil within the recess 34 of silicon substrate 30. With such vacuum evacuation, it is possible by depletion of such voids—which can appear on the inner wall surfaces of recess 34—to suppress or eliminate a decrease in cooling efficiency otherwise occurring due to presence of voids during etching.

Thereafter, as shown in FIG. 15, the n-type epitaxial layer 32 is etched by use of photolithography technology such as RIE techniques with the surface of n-type epitaxial layer 32 (second surface 30b of silicon substrate 30) being first subject to such RIE etching treatment. More precisely, dry etching is carried out (for effecting areal etching) with a mask material 38 disposed on the surface of n-type epitaxial layer 32. This etching results in formation of through-holes 39, which correspond to the vacant space 4 of FIG. 1.

Subsequently, the silicon substrate 30 is taken out of the fluorine-based polymer oil 41 and is then subject to cleaning for removal of any oil contaminants.

Like the first embodiment, the second embodiment offers the ratio of side-etching width (d) versus etching depth (D) as represented by:

$$d/D<10,$$

while resultant temperature increase on the rear surface P1 of the reduced-thickness portion 35 during etching was 180° C. in maximum.

In this embodiment, since the filling material is made of the fluorine-based polymer oil 41 which is one of low-vapor pressure fluids, it hardly vaporizes upon application of heat during etching thus enabling retainment of intended etching circumstances.

Here, silicon-based polymer oil or equivalents thereof may alternatively be employed rather than the fluorine-based polymer oil 41 acting as oil-like medium made of a thermally conductive material.

Third Embodiment

An explanation will be given of a third embodiment of the invention, which may be similar to the first embodiment except for the following points.

Figure 16:
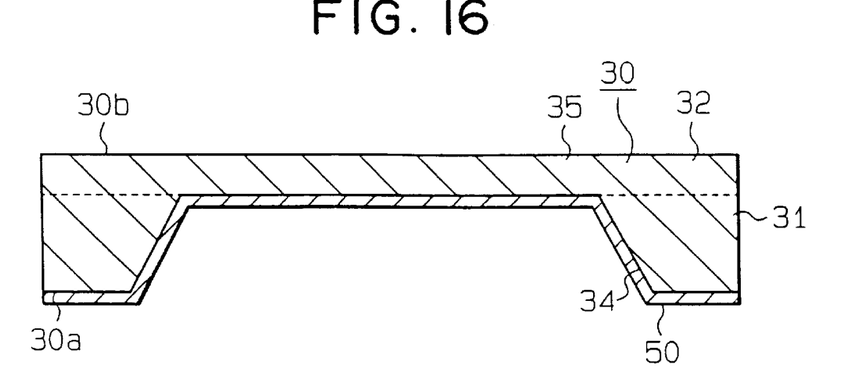
FIGS. 16 and 17 illustrates in cross-section some of the major steps in the manufacture of a semiconductor angular-rate sensor in accordance with a further embodiment of the invention.
Figure 17:
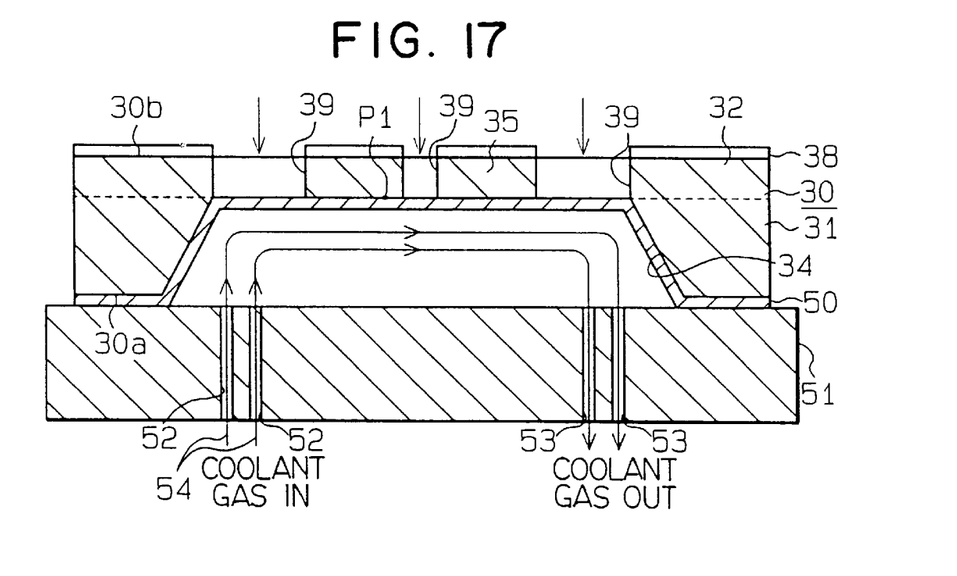

FIGS. 16 and 17 show in cross-section some of the major steps of the manufacture of this embodiment.

First, as already shown in FIGS. 6 and 7, a silicon substrate (wafer) 30 is prepared which has a p-type silicon substrate 31 and n-type epitaxial layer 32 formed thereon; then, each recess 34 is formed in the wafer 30 to have a bottom surface at which a reduced-thickness portion 35 is formed which consists of the n-type epitaxial layer 32.

Then, as shown in FIG. 16, a thin film (formed from material such as Cr, $SiO_2$, Al, Ti, or the like, which is unlikely to be etched by Si-echant) 50 is formed on a first surface 30a of the silicon substrate 30, that is, the inner wall surface of the recess 34 (for example, this is done by vapor deposition). Resultant thin film 50 entirely covers the first surface 30a of silicon substrate 30. The thin film 50 inhibits penetration of gas through it and ensures that non-permeability is retained through the etching process for silicon substrate 30. In this way, thin film 50 is formed on one surface of reduced-thickness portion 35 as formed in silicon substrate 30; this thin-film formation surface at reduced-thickness portion 35 will serve as the gas feed plane to be later described.

Next, as shown in FIG. 17, a base plate 51 is prepared which comes with a gas inlet port 52 and gas outlet port 53. This base plate 51 is arranged so that it can be placed inside the etching chamber (not shown). And, the silicon substrate 30 is disposed on base plate 51 with the thin film 50 facing downward. In this way, prior to execution of etching treatment, silicon substrate 30 with thin film 50 formed thereon is set inside the etching chamber.

Subsequently, refrigerant or coolant gas 54 is fed through the gas inlet port 52 into the recess 34 while allowing the coolant gas to be exhausted externally by way of the gas outlet port 53. The coolant gas used here may be inert gas such as helium or the like. Under this condition, the n-type epitaxial layer 32 is etched by photolithography technology such as RIE techniques with the surface of epitaxial layer 32 (second surface 30b of silicon substrate 30) being first subject to RIE etching treatment. In other words, dry etching is carried out (for attaining areal etching) with a mask material 38 disposed on the surface of layer 32.

Due to the dry etching process, the through-holes 39 which correspond to the vacant space 4 of FIG. 1 are formed by ion impulse or by reaction of reactive ions or radicals. While heat can generate at those locations whereat the through-holes 39 are formed, since the coolant gas 54 is being supplied to the inside of recess 34, such heat will be released externally from the rear surface of silicon substrate 30 avoiding occurrence of a local temperature increase. As a consequence, it will no longer take place that the reaction rate of silicon substrate 30 versus radicals or the like increase, while simultaneously eliminating an increase in side-etching rate as well as deformation of silicon substrate 30 and reduced-thickness portion 35 due to application of thermal stress thereto without leading to occurrence of dry-spot roughness and overetching at the edges of etching mask. Hence, it is possible to prevent in advance a decrease or degradation of the areal etching accuracy. Furthermore, the thin film 50 advantageously serves as a partition wall or "barrier" enabling the inside of recess 34 in the sealed condition; and at the same time, such sealed state created by thin film 50 will never be destroyed when or after the through-holes 39 reach the rear surface of reduced-thickness portion 35.

Thereafter, the silicon substrate 30 is taken out for removal of the thin film 50 by wet etching.

Like the first embodiment, the third embodiment also offers the ratio of side-etching width (d) versus etching depth (D) as represented by:

$$d/D<10,$$

while resultant temperature increase on the rear surface P1 of reduced-thickness portion 35 during etching was 180° C. in maximum.

An advantage of this embodiment is as follows. Mere supplying of coolant gas such as helium to the inside of recess 34 from the side of first surface 30a of silicon substrate 30 without use of the thin film 50 can cause the coolant gas to flow and leak into the front side (inside of the chamber) via the through-holes 39 completed at termination of the etching treatment resulting in disturbance of etching atmospheric conditions. By contrast, with the embodiment, the use of the thin film 50 may permit successful execution of dry etching without having to let the coolant gas leak into the front side by way of resultant through-holes 39. Accordingly, upon completion of such through-holes completely penetrating through the substrate, it becomes possible to prevent the medium from entering or "invading" the inside of the etching chamber.

Another advantage is that the cooling efficiency can be enhanced due to the fact that the cooling gas 54 is fed through the thin film 50 as contacted with the silicon substrate 30.

In the third embodiment mentioned above, while gaseous material is employed as the coolant, it may alternatively be replaced with fluid (such as pure water, lightly impurity-doped silicon oil, or lightly-doped fluorine-based oil).

The present invention may be reduced to practice in a manner other than those of the aforesaid embodiments.

Although the foregoing description assumes the use of silicon substrate as the semiconductor substrate, other kinds of substrates may alternatively be employed such as a GaAs substrate or the like.

Further, the recesses 34 may be formed by wet etching techniques rather than by dry etching techniques.

Furthermore, RIE is used as the dry etching method for formation of the through-holes 39; however, RIEB or the like may alternatively be used therefor.

Still further, the foregoing explanation is directed to a certain case where specified region of the silicon substrate 30 extending from its first surface 30a is first subjected to etching treatment forming recesses 34 thereby to define the reduced-thickness portion 35 at the bottom of each recess 34; however, the present invention should not exclusively be limited thereto. For example, it is available that the semiconductor substrate with reduced-thickness portions at selected locations is attained by lamination of a first silicon substrate having through-holes and a second silicon substrate with no through-holes therein.

Yet further, the principles of the invention may also be applicable to any types of electronic devices other than the angular-rate sensors as discussed previously. In short, the present invention is adaptable for use in fabricating acceleration/angular-rate sensors and equivalents thereof which forms a cantilever or both-end supported beam structure by fabricating a silicon substrate or GaAs substrate.

What is claimed is:

1. A method for manufacturing a semiconductor device comprising the steps of:

forming a through-going opening extending through a reduced-thickness portion in a semiconductor substrate by performing dry etching of certain region from one surface of said reduced-thickness portion of said semiconductor substrate in a state that a gel-like medium made of a thermally conductive material is disposed in contact with an opposite surface of said reduced-thickness portion; and removing said gel-like medium.

2. The method according to claim 1, wherein said gel-like medium is disposed such that said gel-like medium is hardened while causing a liquid medium before hardening to be in contact with the one surface of said reduced-thickness portion.

3. The method according to claim 1, wherein said dry etching includes reactive ion etching.

4. The method according to claim 1, wherein said gel-like medium includes a silicon resin.

5. A method for manufacturing a semiconductor device comprising the steps of:

forming a through-going opening extending through a reduced-thickness portion in a semiconductor substrate by performing dry etching of certain region from one surface of said reduced-thickness portion of said semiconductor substrate in a state that an oil-like medium made of a thermally conductive material is disposed in contact with an opposite surface of said reduced-thickness portion; and removing said oil-like medium.

6. The method according to claim 5, wherein said dry etching includes reactive ion etching.

7. The method according to claim 5, wherein said oil-like medium includes low vapor pressure fluid.

8. The method according to claim 7, wherein said low vapor pressure fluid includes one of fluorine-based polymer oil and silicon-based polymer oil.

9. A method for manufacturing a semiconductor device comprising the steps of:

forming a reduced-thickness portion by etching certain region from a first surface of a semiconductor substrate to provide a recess portion having a bottom for formation of the reduced-thickness portion; and forming a through-going hole extending through said reduced-thickness portion by dry etching of certain region at said reduced-thickness portion from a second surface of said semiconductor substrate while causing a gel-like medium made of a thermally conductive material to be filled in said recess portion; and removing said gel-like medium.

10. The method according to claim 9, wherein said dry etching includes reactive ion etching.

11. The method according to claim 9, wherein said gel-like medium is disposed by rendering said gel-like medium hardened while causing a liquid medium before hardening to be filled in said recess portion.

12. The method according to claim 9, wherein said gel-like medium includes a silicon resin.

13. A method for manufacturing a semiconductor device comprising the steps of:

forming a reduced-thickness portion by etching certain region from a first surface of a semiconductor substrate to provide a recess portion having a bottom for formation of the reduced-thickness portion; and forming a through-going hole extending through said reduced-thickness portion by dry etching of certain region at said reduced-thickness portion from a second surface of said semiconductor substrate while causing an oil-like medium made of a thermally conductive material to be filled in said recess portion; and removing said oil-like medium.

14. The method according to claim 13, wherein said dry etching includes reactive ion etching.

15. The method according to claim 13, wherein said oil-like medium includes low vapor pressure fluid.

16. The method according to claim 15, wherein said low vapor pressure fluid includes one of fluorine-based polymer oil and silicon-based polymer oil.

17. A method for manufacturing a semiconductor device comprising the steps of:

forming a reduced-thickness portion in a semiconductor substrate;

forming a separation film on one surface of said reduced-thickness portion in said semiconductor substrate;

forming a through-going hole extending through said reduced-thickness portion by dry etching of certain region at said reduced-thickness portion while allowing a coolant fluid to be fed on a separation-film forming surface at said reduced-thickness portion; and removing said separation film.

18. The method according to claim 17, wherein said dry etching includes reactive ion etching.

19. The method according to claim 17, wherein said coolant fluid includes a gaseous coolant.

20. The method according to claim 17, wherein said coolant fluid includes inert gas.

21. The method according to claim 17, wherein said coolant fluid is liquid.

22. A method for manufacturing a semiconductor device comprising the steps of:

forming a reduced-thickness portion on a bottom of a recess by etching of certain region from a first surface of a semiconductor substrate;

forming on an inner wall of said recess a separation film acting as a partition wall;

forming a through-going hole extending through said reduced-thickness portion by dry etching of certain region from a second surface of said semiconductor substrate at said reduced-thickness portion while permitting continuous supply of coolant fluid to an inside of said recess; and removing said separation film.

23. The method according to claim 22, wherein said dry etching includes reactive ion etching.

24. The method according to claim 22, wherein said coolant fluid includes a gaseous coolant.

25. The method according to claim 22, wherein said coolant fluid includes inert gas.

26. The method according to claim 22, wherein said coolant fluid is liquid.

* * * * *